United States Patent [19]

Bottcher et al.

[11] 3,764,745

[45] Oct. 9, 1973

[54] MULTIPLE STAGE HEARING AID TRANSISTOR AMPLIFIER HAVING SIGNAL VOLTAGE CONTROLLED FREQUENCY DEPENDENT NETWORK

[75] Inventors: Lutz Bottcher; Karl-August Heyne, both of Berlin, Germany

[73] Assignee: Robert Bosch Elektronik GmbH, Berlin, Germany

[22] Filed: Mar. 5, 1971

[21] Appl. No.: 121,274

[30] Foreign Application Priority Data

Mar. 20, 1970 Germany .................. P 20 13 365.7

[52] U.S. Cl. ............ 179/1 F, 179/107 R, 179/1 D, 330/86

[51] Int. Cl. .............................................. H04r 3/04

[58] Field of Search ................ 179/1 F, 1 D, 107 R; 330/86; 325/424, 399, 187

[56] References Cited

UNITED STATES PATENTS

| | | | |
|---|---|---|---|
| 3,098,199 | 7/1963 | Carney et al. | 330/86 |
| 3,416,094 | 12/1968 | Nakamura | 330/86 |
| 3,581,223 | 5/1971 | Armstrong | 330/86 |
| 3,105,942 | 10/1963 | Hermes | 330/86 |
| 2,262,846 | 11/1941 | Herold | 179/1 D |
| 2,148,030 | 2/1939 | McLennan | 179/1 D |
| 2,388,590 | 11/1945 | Zappacosta | 325/399 |
| 3,497,621 | 2/1970 | Erath | 179/1 D |
| 3,313,885 | 4/1967 | Aiken | 179/1 D |

*Primary Examiner*—Kathleen H. Claffy
*Assistant Examiner*—Douglas W. Olms
*Attorney*—Spencer & Kaye

[57] ABSTRACT

An amplifier with automatic amplification control in which a portion of the audio frequency voltage is tapped from the input or the output of the amplifier and is converted to a d.c. control voltage. At least one network in the amplifier is effective to influence the frequency response of the amplifier in the voice frequency range. Such network can comprise negative feedback circuits or frequency-dependent voltage divider circuits, used individually or in combination, and these circuits include adjustable resistors whose resistance values are determined by the control voltage.

11 Claims, 13 Drawing Figures

Fig. 1
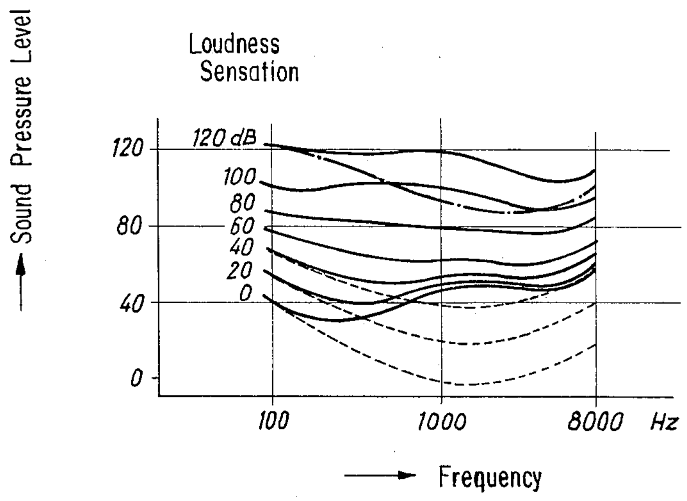
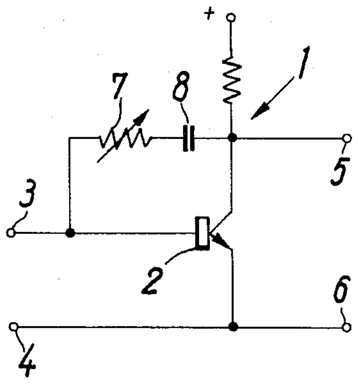
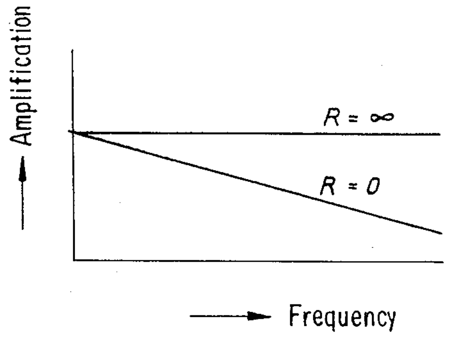
Fig. 2a Fig. 2b
*Inventors.*
Lutz Böttcher
Karl-August Heyne
BY Spencer & Kaye
ATTORNEYS.

Inventors
Lutz Böttcher
Karl-August Heyne
BY Spencer & Kaye
ATTORNEYS.

Inventors.
Lutz Böttcher
Karl-August Heyne
BY Spencer & Kaye
ATTORNEYS.

MULTIPLE STAGE HEARING AID TRANSISTOR AMPLIFIER HAVING SIGNAL VOLTAGE CONTROLLED FREQUENCY DEPENDENT NETWORK

BACKGROUND OF THE INVENTION

The present invention relates to a multiple stage transistor amplifier for hearing aids with automatic amplification control wherein a portion of the audio frequency voltage is tapped from the input or output of the amplifier and is converted to a d.c. control.

In order to convey a sound impression to persons with impaired hearing so that this impression will closely approximate that received by a person with normal hearing, hearing aids with amplifiers are employed. In the simplest case these amplifiers raise the sound level to be amplified to such an extent that the hearing threshold of the impaired ear approximately coincide with the hearing threshold of the normal ear. In this situation frequency-dependent deviations in the sensitivity of the impared ear can be corrected, for example, by influencing the high and/or low frequency reproduction by means of a tone control.

With certain types of hearing impairment the affected ear receives a reduced sound impression, when compared with that of a normal ear, only up to a certain sound pressure level. Above this sound level a so-called recruitment, i.e. loudness equalization, occurs in which the impaired ear then hears something just as loud as the normal ear. With a further increase in the sound level the impaired ear may possibly react with even more sensitivity than an unimpaired ear. In such cases, the amplifier of the hearing aid must not uniformly raise all the input sound pressure levels by a certain amount, rather the amplifier must be provided with a dynamic control which causes low sound pressure levels to be amplified more strongly than high sound pressure levels and which, if required, even furnishes an output sound pressure level which is less than the input sound pressure when such sound pressure levels are high.

Three methods are conventionally employed for the dynamic control in hearing aid amplifiers, i.e. the automatic volume control (AVC), the amplitude limitation (peak clipping - PC) and the dynamic range compression (DRC). In all three methods, however, no consideration has been given to the fact that recruitment depends on the frequency.

SUMMARY OF THE INVENTION

It is an object of the invention to eliminate the shortcomings of the devices now used.

It is another object of the present invention to develop a hearing aid amplifier which automatically compensates the frequency dependence of the recruitment and which furthermore is of such a universal nature that it can also be employed for other hearing defects which comprise a sound pressure level and a frequency dependent component.

This is accomplished in a multi-stage transistor amplifier for hearing aids with automatic volume control in which a portion of the audio frequency voltage is tapped from the input or output of the amplifier and is converted to a d.c. control voltage which effects the amplification control. Such control is possible because the amplifier circuit comprises at least one network whch influences the frequency response of the amplifier in the voice frequency range. The frequency characteristic of this network is automatically variable through the use of the d.c. control voltage which depends exclusively on the average amplitude of the audio frequency voltage.

BRIEF DESCRIPTION OF THE DRAWINGS

FIG. 1 is a diagram which shows the relationship between the sound pressure level, the frequency and the loudness sensation of an ear with recruitment.

FIG. 2*a* is a circuit diagram of an amplifier stage, according to the invention, with frequency dependent negative voltage feedback in the collector-base circuit of the transistor.

FIG. 2*b* is a diagram showing the amplification of the amplifier stage according to FIG. 2*a* as dependent on the frequency.

DESCRIPTION OF THE PREFERRED EMBODIMENTS

Figure 3:
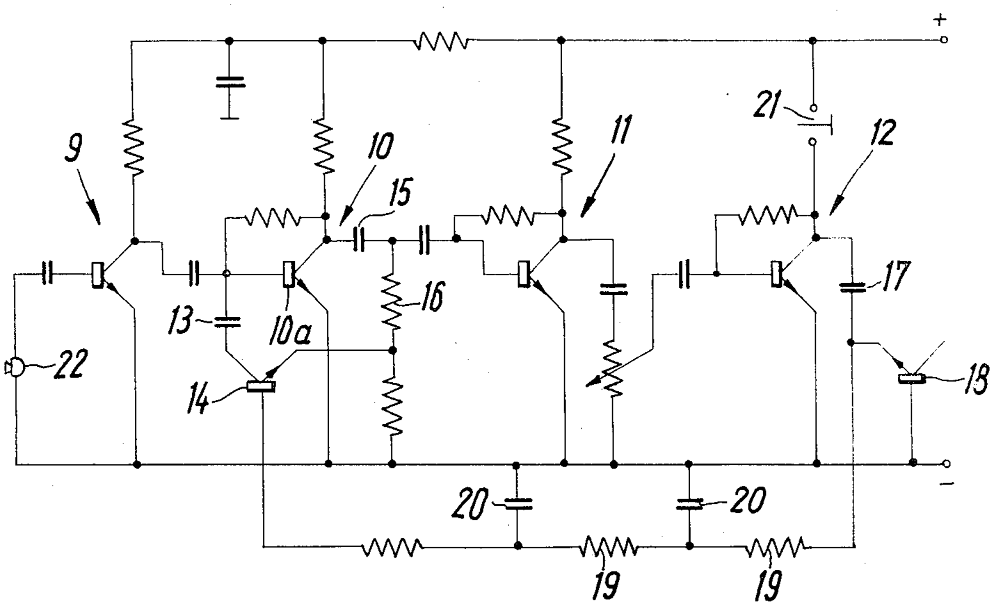
FIG. 3 is a circuit diagram of a hearing aid according to the invention, with a frequency dependent negative feedback which can be influenced by a d.c. control voltage.

The diagram of FIG. 1 shows in solid lines the hearing properties of an impaired ear with recruitment. For comparison some characteristic lines of a normal ear are shown in FIG. 1 by dashed lines. This diagram reveals that in the vicinity of the hearing threshold the lines of identical loudness sensation for the impaired ear have almost the same waveform, below approximately 250 Hz, as for a normal ear. The center frequency range, however, is strongly impaired, whereas in the direction of the higher frequencies an approximation to the characteristics of the normal ear can again be noticed, even though it is not as close an approximation. Attention is now directed to the center frequency range of the diagram of FIG. 1, and to the area between the dashed line, showing the 40 db line of identical loudness sensation for the normal ear, and the 60 db line, the full line, for the impaired ear. It should be mentioned here that the 60 db lines coincide approximately for the normal and the impaired ear. As can be seen, the 0 to 60 db lines of the impaired ear are crowded into this area.

Above the 60 db line the impaired ear again experiences the same loudness sensation as a normal ear. However, in some cases a recruitment brings with it a reduction in the pain threshold (negative recruitment). This is illustrated by the dot-dash 120 db line in FIG. 1.

A hearing aid for compensating the above-mentioned impairment must, since the recruitment is also frequency dependent, be provided with a frequency dependent dynamic control.

As seen in FIG. 2*a*, the amplifier stage 1 of a transistor amplifier for hearing aids comprises a transistor 2 into whose emitter-base circuit, which is provided with two terminals 3, 4, is fed the voice frequency voltage to be amplified. The amplified voltage can be tapped between the collector and the emitter of transistor 2 or between terminals 5 and 6, respectively.

Collector and base of transistor 2 are connected via a frequency dependent network consisting of a series connection of an adjustable resistor 7 and a capacitor 8. Any change in the resistance value of the adjustable resistor 7 produces a change in the negative a.c. voltage feedback of the amplifier stage.

FIG. 2*b* shows the effect of two extreme changes in the resistance value of resistor 7. With an adjustable resistor 7 having the resistance value $R = \infty$ no negative feedback will occur, i.e. the amplification maintains a constant value over the entire transmission range. This constant value corresponds to the maximum amplification of the amplifier stage with a defined circuit configuration.

On the other hand, with decreasing resistance value the amplification depends on the frequency, i.e. the amplification decreases with increasing frequency. At a resistance value $R = 0$ and at the maximum transmission frequency, amplification is at a minimum. Depending on the instantaneous resistance value of the adjustable resistor 7 and the capacitance value of the capacitor 8, different characteristic curves can be realized for the amplifier stage 1.

According to the circuit diagram of FIG. 3 such an amplification stage is employed in somewhat modified form in a transistor amplifier having four amplifier stages 9, 10, 11 and 12. The design of such an amplifier is known in the art and it is not thought necessary to describe it in detail, except for the features of the present invention. The amplifier stage with adjustable negative feedback in this case is the second amplifier stage 10 with transistor **10*a*. The frequency dependent network which effects the negative voltage feedback includes a capacitor 13 and an adjustable resistor in the form of the emitter-collector path of a transistor 14. According to the circuit design, the negative feedback branch goes from the collector of transistor 10*a* via a coupling capacitor 15 having a relatively high capacitance value, a resistor 16, the emitter-collector path of transistor 14 and capacitor 13, to the base of the transistor 10*a*.**

A variation in the control voltage for the transistor 14 produces a change in the resistance value of the emitter-collector path and thus in the degree of the negative feedback in dependence on the frequency. The resulting amplification for the amplifier stage 10 lies between the characteristics for $R = \infty$ and $R = 0$ (see diagram of FIG. 2*b*).

Figure 8:
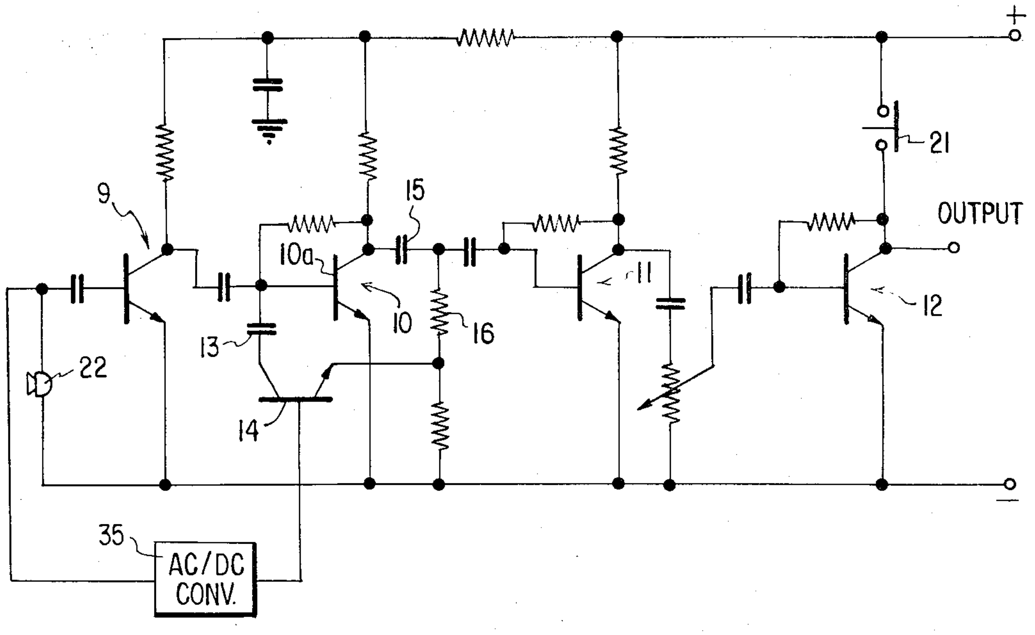
FIG. 8 is a diagram similar to that of FIG. 3 of an embodiment of the invention in which the control voltage is derived from the amplifier input.

The control voltage for transistor 14 is preferably a d.c. control voltage which is dependent on the average amplitude of the audio frequency voltage. In the present circuit embodiment, the d.c. control voltage is derived in such a manner that the audio frequency voltage is tapped at the output of the last amplifier stage of the transistor amplifier, is brought through a capacitor 17, is rectified by means of the emitter-base diode path of a transistor 18 and is smoothed by means of a filter circuit consisting of resistors 19 and capacitors 20. The d.c. control voltage may also be derived from the input voltage of the transistor amplifier. Such an arrangement is shown in FIG. 8 where the base of transistor 14 is connected to the amplifier input via a suitable AC/DC converter 35. Converter 35 can be of any suitable type and could, for example, include a transistor connected in a manner similar to transistor 18 of FIG. 3 and associated with a filter circuit similar to the circuit composed of elements 19 and 20 of FIG. 3.

Figure 4:
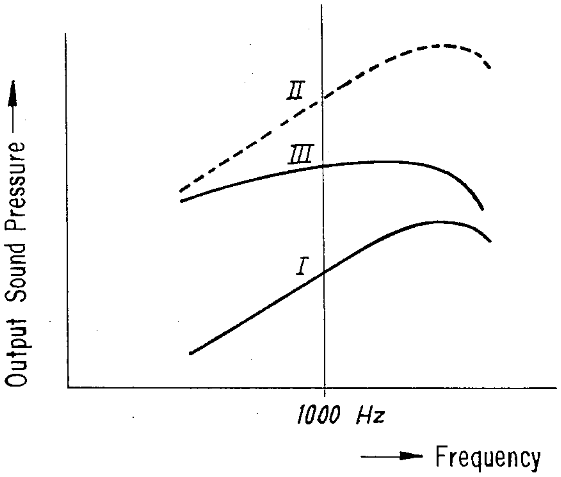
FIG. 4 is a diagram showing the output sound pressure of the hearing aid according to FIG. 3 as dependent on the frequency.

With suitable choice of the components of the negative feedback circuit of the amplifier stage 10 the negative feedback is varied by the d.c. control voltage in such a manner that, for example, a frequency dependence as shown in the diagram of FIG. 4 results for the output sound pressure P of the sound converter to be connected to the audio frequency output 21 of the amplifier. The characteristic I is produced if a tone control, which is not shown in the amplifier circuit of FIG. 3, is set on "high", i.e. when the high audio frequencies are emphasized in the amplification and when a relatively low input sound pressure is present at the microphone 22 of the transistor amplifier.

The characteristic I shows that the output sound pressure P increases approximately proportionally with increasing frequency up to a certain limit. Since, however, with a relatively high input sound pressure, as shown in dashed line II, a proportional increase of the output sound pressure would inevitably lead to or even exceed the pain threshold, care must be taken that the output sound pressure remains approximately the same in spite of increases in frequency or — with negative recruitment — decreases if necessary. This is accomplished by the frequency dependent negative feedback which is automatically varied by the d.c. control voltage.

It will be recalled that, as shown in FIG. 2*b*, the amplification decreases with increasing frequency at a resistance value, other than $R = \infty$ , for the emitter-collector path of the transistor 14 of transistor stage 10. This leads to the characteristic, shown by solid line III, in the diagram of FIG. 4 and which, compared with the characteristic II which is not desired in practice, clearly shows a reduction of the output sound pressure at higher frequencies. FIG. 4 thus indicates that the dynamic range is compressed more and more with increasing frequency which corresponds to a frequency dependent dynamic compression.

Figure 5A:
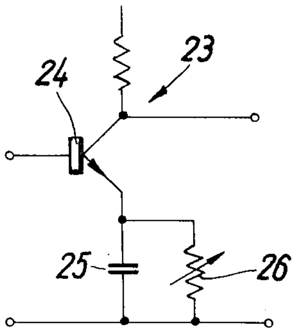
FIG. 5*a* is a circuit diagram of another amplifier stage according to the invention, having a frequency dependent negative current feedback.

As disclosed in FIG. 5*a* a frequency dependent alternating current negative feedback can be realized in an amplifier stage 23 by a network disposed in the emitter lead of transistor 24 and consisting of the parallel connection of a capacitor 25 and an adjustable resistor 26.

Figure 5B:
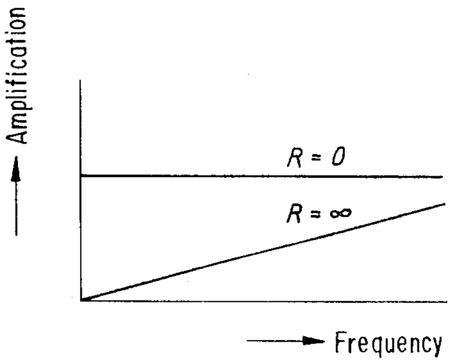
FIG. 5*b* is a diagram showing the amplification of the amplifier stage of FIG. 5*a* as dependent on the frequency.

A comparison of the diagram of FIG. 5*b* with the diagram of FIG. 2*b* indicates that the amplifier stage according to FIG. 5*a* differs from that shown by FIG. 2*a* in the effect of the negative feedback resulting in a different waveform for the characteristic curves. Thus, as seen in FIG. 5b, the amplification increases with increasing frequency as long as the resistance value of the adjustable resistor 26 has a value other than zero. The adjustable resistor 26 used in practice may again be the emitter-collector path of a transistor which is controlled by a d.c. control voltage as in the embodiment according to FIG. 3. The amplifier stage 23 could be used to construct a multi-stage transistor amplifier for a hearing aid whose output sound pressure would increase with increasing frequency.

Combined application of the negative feed-back circuits as shown in FIGS. 2a and 5a permits the realization of any desired shapes of characteristics for the output sound pressure.

Figure 6A:
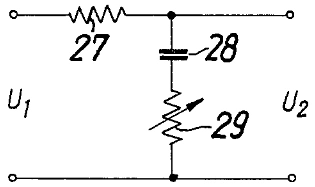
FIG. 6*a* is a circuit diagram of a frequency dependent voltage divider as used in the invention, in a first embodiment.
Figure 6B:
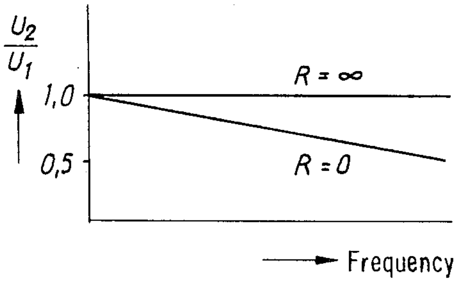
FIG. 6*b* is a diagram showing the ratio of output voltage to input voltage as dependent on frequency in the voltage divider according to FIG. 6*a*.
Figure 7A:
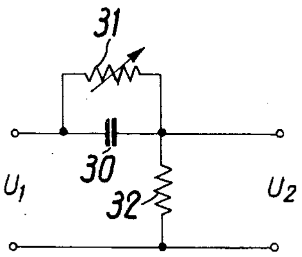
FIG. 7*a* is a circuit diagram of a second embodiment of a frequency dependent voltage divider as used in the invention.

Other circuits for controlling the effect of frequency changes on the loudness sensation with different levels of sound pressure are shown in FIGS. 6a and 7a.

FIG. 6a shows a frequency dependent network which comprises a voltage divider consisting of a resistor 27, a capacitor 28 and an adjustable resistor 29. The output voltage $U_2$ tapped at the series connection of capacitor 28 and adjustable resistor 29 decreases in proportion with the input voltage $U_1$ with increasing frequency as long as the adjustable resistor 29 has a resistance value other than zero. If a voltage divider of the type shown in FIG. 6a is employed, for example, between two adjacent amplifier stages of a multi-stage transistor amplifier for hearing aids and the adjustable resistor 29 is formed by the emitter-collector path of a transistor which is controlled by the d.c. control voltage derived from the average amplitude of the input or output voltage, the characteristic produced for the output sound pressure of the hearing aid will be similar to characteristic III as shown in FIG. 4.

Figure 7B:
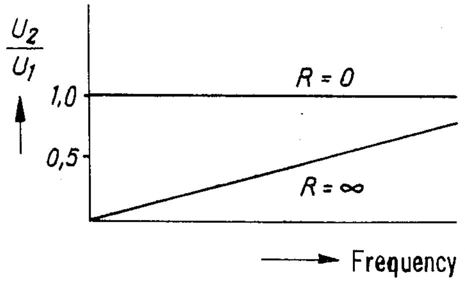
FIG. 7*b* is a diagram showing the ratio of output voltage to input voltage as dependent on frequency in the voltage divider of FIG. 7*a*.

In an analogous manner a voltage divider, as seen in FIG. 7a, comprising a parallel connection of a capacitor 30 and an adjustable resistor 31 as well as a resistor 32 connected in series with the parallel circuit produces a characteristic as indicated in FIG. 7b which can be controlled by varying the resistance value of the adjustable resistor 31. The statements made in connection with FIG. 6a also apply for the control of the adjustable resistor 31.

According to the diagram of FIG. 7b, the output voltage $U_2$ tapped at resistor 32 increases with increasing frequency in proportion with the input voltage $U_1$ of the voltage divider with the prerequisite that the resistance value of resistor 31 is greater than zero.

Figure 9:
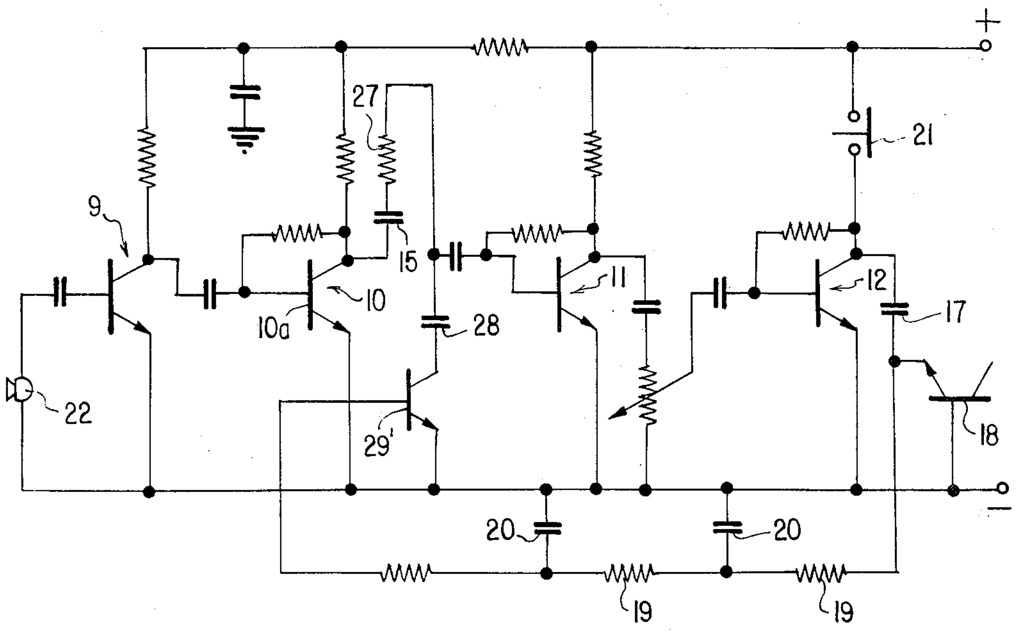
FIG. 9 is a diagram similar to that of FIG. 3 of an embodiment of the invention employing the frequency dependent voltage divider of FIG. 6*a*.

FIG. 9 shows a circuit similar to that of FIG. 3 in which the negative feedback circuit is replaced by the frequency-dependent voltage divider of FIG. 6a. The frequency dependent voltage divider is connected between amplifier stages 10 and 11 in a straightforward manner with series resistor 27 connected between the output of stage 10 and the input of stage 11 and with adjustable shunt resistor 29', constituted by the collector-emitter path of a transistor, connected between the common connection for all of the amplifier stages and a point between resistor 27 and the input to stage 11. The frequency-dependent voltage divider is completed by the capacitor 28 connected in series with adjustable resistor 29'. As in the embodiment of FIG. 3, the control voltage is applied to the base of transistor 19. This control voltage is derived from the amplifier output, is rectified by the emitter-base diode path of transistor 18, and is smoothed by the filter circuit consisting of resistors 19 and capacitors 20.

The networks disclosed in FIGS. 6a and 7a can be used in combination in a multi-stage transistor amplifier and, if required, a combination of one of the amplifier stages according to FIGS. 2a and 5a with a network according to FIGS. 6a and 7a may also be advisable.

Finally, it may be desirable to insert, in a circuit according to FIG. 3 or in a circuit modified within the scope of the present invention, an adjustable tone control such as it is conventionally used in hearing aids. The tone control can then be tuned once, for example, to a fixed value.

It will be understood that the above description of the present invention is susceptible to various modifications, changes and adaptations, and the same are intended to be comprehended within the meaning and range of equivalents of the appended claims.

We claim:

1. A multi-stage transistor amplifier for a hearing aid comprising in combination:

a. means for deriving from a point in said amplifier an audio frequency voltage whose amplitude is proportional to that of the audio frequency signal at a point along the forward amplification path of the amplifier;

b. means for converting said audio frequency voltage into a d.c. control voltage;

c. a circuit network including a frequency dependent negative feedback circuit connected in the amplifier for influencing the frequency response thereof in the voice frequency range, said circuit including a capacitance as its only reactive element and having a frequency characteristic which is free of any resonance in the voice frequency range; and d. means for applying said control voltage to said frequency dependent circuit, whereby the frequency characteristics of said frequency dependent circuit are varied in response to changes in the amplitude of said audio frequency voltage.

2. A multi-stage transistor amplifier as defined in claim 1, wherein said negative feedback circuit is connected between the collector and the base of a transistor in an amplification stage.

3. A multi-stage transistor amplifier as defined in claim 2, wherein sad frequency dependent circuit in said negative feedback circuit includes means whose electrical resistance is changed in response to changes in the amplitude of the control voltage.

4. A multi-stage transistor amplifier as defined in claim 3, wherein said means whose electrical resistance can be changed comprises the emitter-collector path of a second transistor, controlled by the d.c. control voltage.

5. A multi-stage transistor amplifier as defined in claim 2, wherein said frequency dependent circuit in said negative feedback circuit includes a capacitor and a variable resistor connected in series.

6. A multi-stage transistor amplifier for a hearing aid comprising in combination:

a. means for deriving from a point in said amplifier an audio frequency voltage whose amplitude is proportional to that of the audio frequency signal at a point along the forward amplification path of the amplifier;

b. means for converting said audio frequency voltage into a d.c. control voltage;

c. a circuit network including a frequency-dependent voltage divider operatively connected between the output of one stage of said amplifier and the input of the next succeeding stage of said amplifier for influencing the frequency response thereof in the voice frequency range, said divider including a series resistor connected between the output of said one stage and the input of said next succeeding stage, and a shunt resistor having one end connected to a point between said series resistor and said next succeeding stage input, one of said resistors being an electronically adjustable element whose resistance is changed in response to a voltage applied thereto, said circuit including a capacitance as its only reactive element and having a frequency characteristic which is free of any resonance in the voice frequency range; and d. means for applying said control voltage to said adjustable element of said frequency-dependent circuit, whereby the frequency characteristics of said frequency-dependent circuit are varied in response to changes in the amplitude of said audio frequency voltage.

7. A multi-stage transistor amplifier as defined in claim 6 wherein said adjustable element constitutes said shunt resistor and said capacitance comprises a capacitor connected in series with said adjustable element.

8. A multi-stage transistor amplifier as defined in claim 7 wherein said adjustable element comprises the emitter-collector path of a transistor whose base is connected to receive said d.c. control voltage to cause the resistance of said adjustable element to be controlled by said control voltage.

9. A multi-stage transistor amplifier as defined in claim 6 wherein said adjustable element constitutes said series resistor and said capacitance comprises a capacitor connected in parallel with said series resistor.

10. A multi-stage transistor amplifier as defined in claim 9 wherein said adjustable element comprises the emitter-collector path of a transistor whose base is connected to receive said d.c. voltage to cause the resistance of said adjustable element to be controlled by said control voltage.

11. A multi-stage transistor amplifier for a hearing aid comprising in combination:

a. means for deriving from a point in said amplifier an audio frequency voltage whose amplitude is proportional to that of the audio frequency signal at a point along the forward amplification path of the amplifier;

b. means for converting said audio frequency voltage into a d.c. control voltage;

c. a circuit network including a frequency-dependent circuit comprising a variable resistor and a capacitor connected in parallel in the emitter lead of a transistor of one of the stages for influencing the frequency response of the amplifier in the voice frequency range; and d. means for applying said control voltage to said frequency-dependent circuit, whereby the frequency characteristics of said frequency-dependent circuit are varied in response to changes in the amplitude of said audio frequency voltage.

* * * * *